(12) United States Patent
Roh et al.

(10) Patent No.: US 9,559,271 B2
(45) Date of Patent: Jan. 31, 2017

(54) OXYNITRIDE-BASED PHOSPHOR AND WHITE LIGHT EMITTING DEVICE INCLUDING THE SAME

(71) Applicant: SAMSUNG ELECTRONICS CO., LTD., Suwon-si (KR)

(72) Inventors: Hee Suk Roh, Seoul (KR); Seong Min Kim, Seongnam-si (KR); Jae Hyun Ryu, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/969,192

(22) Filed: Dec. 15, 2015

(65) Prior Publication Data

US 2016/0181484 A1 Jun. 23, 2016

(30) Foreign Application Priority Data

Dec. 22, 2014 (KR) ........................ 10-2014-0186235

(51) Int. Cl.
*H01L 33/00* (2010.01)
*H01L 33/50* (2010.01)
*C09K 11/77* (2006.01)
*H01L 33/54* (2010.01)
*H01L 27/15* (2006.01)

(52) U.S. Cl.
CPC ......... *H01L 33/505* (2013.01); *C09K 11/7734* (2013.01); *H01L 27/156* (2013.01); *H01L 33/502* (2013.01); *H01L 33/504* (2013.01); *H01L 33/54* (2013.01)

(58) Field of Classification Search
CPC .... H01L 33/505; H01L 27/156; H01L 33/504; H01L 33/54; C99K 11/7734
USPC .......................................................... 257/88
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

CN 101821356 A 9/2010
EP 2213711 A1 8/2010

(Continued)

*Primary Examiner* — David S Blum
(74) *Attorney, Agent, or Firm* — Sughrue Mion, PLLC

(57) ABSTRACT

There is provided an oxynitride-based phosphor comprising a β-type $Si_3N_4$ crystal structure and represented by a compositional formula of $Si_{6-x}Al_xO_xN_{8-x}:Eu_y$ ($0<x\leq0.3$, $0.001\leq y\leq0.03$), the oxynitride-based phosphor having a form of a secondary particle comprising a plurality of primary particles bonded to each other, the plurality of primary particles having pillar shapes.

20 Claims, 13 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,003,011 B2 | 8/2011 | Hirosaki et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,057,705 B2 | 11/2011 | Sakuma et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,518,300 B2 | 8/2013 | Sakai et al. |
| 8,536,604 B2 | 9/2013 | Kwak et al. |
| 8,709,838 B2 | 4/2014 | Suzuki et al. |
| 8,735,931 B2 | 5/2014 | Han et al. |
| 8,766,295 B2 | 7/2014 | Kim |
| 2007/0108896 A1 | 5/2007 | Hirosaki |
| 2010/0213820 A1 | 8/2010 | Sakai et al. |
| 2012/0026426 A1 | 2/2012 | Hanamoto et al. |
| 2012/0228551 A1 | 9/2012 | Emoto et al. |
| 2013/0093314 A1 | 4/2013 | Takeda et al. |
| 2013/0153824 A1 | 6/2013 | Fujinaga et al. |
| 2013/0241397 A1 | 9/2013 | Hong et al. |
| 2013/0300014 A1 | 11/2013 | Emoto |
| 2014/0218658 A1 | 8/2014 | Masuda et al. |

FOREIGN PATENT DOCUMENTS

| | | | |
|---|---|---|---|
| JP | 2013-136768 A | 7/2013 | |
| JP | EP 2623580 A1 * | 8/2013 | ......... C09K 11/0883 |
| JP | 2013-216909 A | 10/2013 | |
| KR | 10-1253079 B1 | 4/2013 | |
| WO | 2009/048150 A1 | 4/2009 | |

* cited by examiner

OXYNITRIDE-BASED PHOSPHOR AND WHITE LIGHT EMITTING DEVICE INCLUDING THE SAME

CROSS-REFERENCE TO RELATED APPLICATION

This application claims priority from and the benefit of Korean Patent Application No. 10-2014-0186235 filed on Dec. 22, 2014, with the Korean Intellectual Property Office, the disclosure of which is incorporated herein by reference.

BACKGROUND

Semiconductor light emitting devices emit light through the recombination of electrons and holes when an electrical current is applied thereto, and have been widely used as light sources due to several inherent advantages thereof, such as relatively low power consumption, high degrees of luminance, compactness, and the like. In particular, after the development of nitride-based light emitting devices, the range of applications of semiconductor light emitting devices has expanded, and such semiconductor light emitting devices have been employed in backlight units, domestic lighting devices, automobile lighting devices, and the like.

Light emitting devices using the semiconductor light emitting devices as described above may include a light emitting element providing excitation light and phosphors excited by light having been emitted by the light emitting element to thereby emit wavelength-converted light, such that desired color characteristics may be implemented therein. Research for improving process properties in a process including such a phosphor is in demand.

SUMMARY

One or more exemplary embodiments may provide an oxynitride-based phosphor having a form allowing for improvements in process properties.

According to an aspect of an exemplary embodiment, an oxynitride-based phosphor is provided. The oxynitride-based phosphor includes a β-type $Si_3N_4$ crystal structure and represented by a compositional formula of $Si_{6-x}Al_xO_xN_{8-x}$:$Eu_y$ ($0<x\leq0.3$, $0.001\leq y\leq0.03$), the oxynitride-based phosphor having a form of a secondary particle comprising a plurality of primary bonded to each other, the plurality of primary particles having pillar shapes.

An angle of repose of the oxynitride-based phosphor may be 40 degrees or less.

The secondary particle has a form in which the plurality of primary particles may be bonded to each other in a radial manner.

The secondary particle may have a form in which the plurality of primary particles are bonded to each other in such a manner that at least two major axial directions of the plurality of primary particles are identical to each other.

The plurality of primary particles may respectively have an aspect ratio of 1 to 100.

The oxynitride-based phosphor may have an average particle size $D_{50}$ of 5 μm to 30 μm.

A quartile deviation (Q.D.) of a particle size of the oxynitride-based phosphor may be 0.18 to 0.40.

The oxynitride-based phosphor irradiated by an excitation source may emit light having a peak wavelength in a range of 525 nm to 550 nm.

The excitation source may have a peak wavelength in a range of 420 nm to 470 nm.

In the compositional formula, x may be in a range of $0.05\leq x\leq0.28$.

In the compositional formula, y may be in a range of $0.003\leq y\leq0.028$.

According to an aspect of another exemplary embodiment, a white light emitting device may include a semiconductor light emitting device emitting excitation light, the oxynitride-based phosphor according to the exemplary embodiments as described above, disposed in a circumferential portion of the semiconductor light emitting device and converting a wavelength of at least a portion of the excitation light into a wavelength of green light, and at least one light emitting element providing light having a wavelength different from the wavelength of light emitted by the semiconductor light emitting device and the converted wavelength of green light, wherein the at least one light emitting element is at least one of another semiconductor light emitting device and another phosphor.

The semiconductor light emitting device may be a blue semiconductor light emitting device having a dominant wavelength of 420 nm to 470 nm.

The at least one light emitting element may include a red phosphor.

The at least one light emitting element may include a yellow phosphor or a yellow-orange phosphor.

According to an aspect of another exemplary embodiment, a white light emitting device is provided. The white light emitting device includes: a semiconductor light emitting device emitting excitation light, the semiconductor light emitting device comprising a β-type $Si_3N_4$ crystal structure and represented by a compositional formula of $Si_{6-x}Al_xO_xN_{8-x}$:$Eu_y$ ($0<x\leq0.3$, $0.001\leq y\leq0.03$); and at least one light emitting element providing light having a wavelength different from a wavelength of light emitted by the semiconductor light emitting device, wherein the at least one light emitting element is at least one from among another semiconductor light emitting device and another phosphor.

The oxynitride-based phosphor may be disposed in a circumferential portion of the semiconductor light emitting device.

The oxynitride-based phosphor may be configured to convert a wavelength of at least a portion of the excitation light into a wavelength of green light.

The oxynitride-based phosphor may include a form of a secondary particle comprising a plurality of primary particles bonded to each other, the plurality of primary particles having pillar shapes.

BRIEF DESCRIPTION OF DRAWINGS

The above and other aspects, features and advantages of the exemplary embodiments will be more clearly understood from the following detailed description taken in conjunction with the accompanying drawings, in which.

DETAILED DESCRIPTION OF EXEMPLARY EMBODIMENTS

Figure 1:
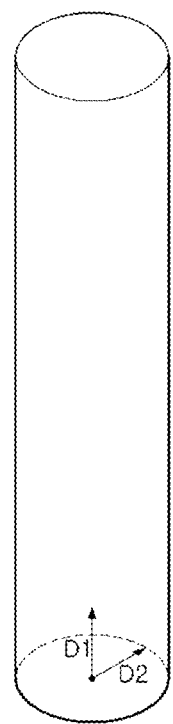
FIG. 1 is a schematic view illustrating a primary particle of an oxynitride-based phosphor according to an exemplary embodiment.

Exemplary embodiments will now be described in detail with reference to the accompanying drawings.

The exemplary embodiments may, however, be exemplified in many different forms and should not be construed as being limited to the specific exemplary embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

The exemplary embodiments are not limited to specific forms illustrated in the drawings and may also include variations in forms generated according to a manufacturing process. For example, an etched region having a rectangular shape illustrated in an exemplary embodiment may be rounded or may have a predetermined degree of curvature. Thus, regions illustrated in the drawings may have schematic properties, and shapes of the regions are merely provided to exemplify certain forms of regions of a device and are not intended to limit the scope of the exemplary embodiments.

Unless explicitly described otherwise, in the specification, the terms 'on', 'upper surface', 'below', 'lower surface', 'upward', 'downward', 'lateral surface', 'high', 'low' and the like are used based on the drawings, and may actually be varied depending on a direction in which a light emitting device is disposed. In addition, 'on' and 'under' may include all of concepts 'being directly formed' or 'being indirectly formed'.

An aspect of an exemplary embodiment may provide an oxynitride-based phosphor including a β-type $Si_3N_4$ crystal structure and represented by a compositional formula of $Si_{6-x}Al_xO_xN_{8-x}:Eu_y$ ($0<x\leq0.3$, $0.001\leq y\leq0.03$), the oxynitride-based phosphor having a form of a secondary particle comprising a plurality of primary particles having pillar shapes bonded to each other.

A europium (Eu) dissolved β-type sialon in which aluminum (Al) is substituted in a silicon (Si) site and oxygen (O) is substituted in a nitrogen (N) site, in the β-type $Si_3N_4$ crystal structure, may be represented by the compositional formula of $Si_{6-x}Al_xO_xN_{8-x}:Eu_y$. The oxynitride-based phosphor, β-type sialon, may have superior excitation/light emission properties as well as excellent temperature and humidity stability due to a high level of covalent binding index and a low level of electron affinity.

Since the β-type sialon belongs to a hexagonal system and has a high degree of crystalline anisotropy, it may have properties liable to be grown as primary particles having pillar shapes. In the case of primary particles having pillar shapes, a surface area thereof is larger as compared to the case of spherical particles and accordingly, van der Waals force generated on a surface may be relatively high. Due to the force, the β-type sialon formed of primary particles having pillar shapes may have a low degree of fluidity.

FIG. 1 is a schematic view illustrating a primary particle of an oxynitride-based phosphor according to an exemplary embodiment.

Referring to FIG. 1, a primary particle 1 of the oxynitride-based phosphor may have an aspect ratio, a ratio of a distance in a major axial direction D1 to a distance in a minor axial direction D2, in a range of from 1 to 100. In accordance with an increase in the aspect ratio of the oxynitride-based phosphor having pillar-shaped particles, particle fluidity may be degraded.

Although FIG. 1 illustrates a case in which the primary particle 1 of the oxynitride-based phosphor has a circular cross-section in the minor axial direction D2, the present exemplary embodiment is not limited thereto, and the primary particle 1 of the oxynitride-based phosphor may have a polygonal cross-section such as a quadrangular cross-section or the like.

FIGS. 2A through 2D are schematic views illustrating forms of secondary particles of the oxynitride-based phosphor according to an exemplary.

Figure 2A:
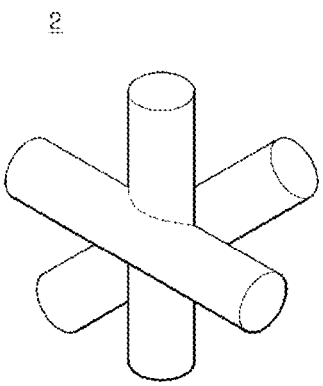
FIGS. 2A through 2D are schematic views illustrating various forms of secondary particles of the oxynitride-based phosphor according to an exemplary embodiment.

Referring to FIG. 2A, a secondary particle 2 of the oxynitride-based phosphor may have a form in which primary particles 1 of the oxynitride-based phosphor illustrated in FIG. 1 are bonded to each other in a radial manner, while maintaining shapes thereof. In other words, a plurality of primary particles 1 may be bonded to each other such that respective major axial directions D1 (please refer to FIG. 1) thereof do not coincide with each other. The bond may be a chemical bond formed through a chemical reaction. Although FIG. 2A illustrates a case in which three primary particles 1 are bonded to one another, the exemplary embodiment is not limited thereto and four or more primary particles 1 may be bonded to one another. In addition, although FIG. 2A illustrates a case in which a plurality of primary particles 1 are bonded to one another in central portions thereof, the exemplary embodiment is not limited thereto, and positions in which the plurality of primary particles 1 are bonded to one another may be variously disposed.

Figure 2B:
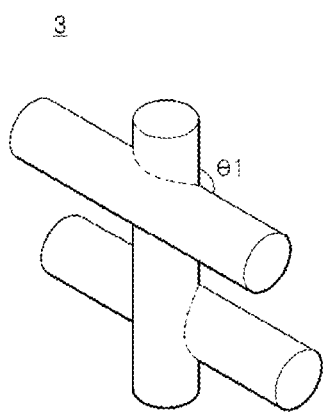

Referring to FIG. 2B, a secondary particle 3 of the oxynitride-based phosphor may have a form in which a plurality of primary particles 1 of the oxynitride-based phosphor illustrated in FIG. 1 are bonded to each other in such a manner that an angle θ1 formed by two major axes and a single remaining major axis of the plurality of primary particles 1 is 90 degrees, while shapes of the primary particles 1 are maintained. Although FIG. 2B illustrates a case in which three primary particles 1 are bonded to one another, the exemplary embodiment is not limited thereto and four or more primary particles 1 may be bonded to one another. In addition, positions in which the plurality of primary particles 1 are bonded to one another may be variously disposed.

Figure 2C:
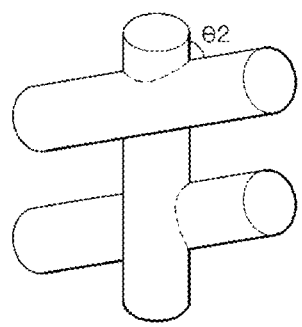

Referring to FIG. 2C, a secondary particle 4 of the oxynitride-based phosphor may have a form in which a plurality of primary particles 1 of the oxynitride-based phosphor illustrated in FIG. 1 are bonded to each other in such a manner that an angle θ2 formed by two major axes parallel to each other and a single remaining major axis of the plurality of primary particles 1 is an acute angle, while shapes of the primary particles 1 are maintained. Although FIG. 2C illustrates a case in which three primary particles 1 are bonded to one another, the exemplary embodiment is not limited thereto and four or more primary particles 1 may be bonded to one another. In addition, positions in which the plurality of primary particles 1 are bonded to one another may be variously disposed.

Figure 2D:
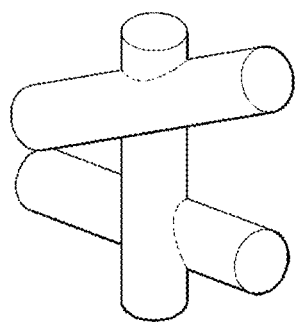

Referring to FIG. 2D, a secondary particle 5 of the oxynitride-based phosphor may have a form in which a plurality of primary particles 1 of the oxynitride-based phosphor illustrated in FIG. 1 are bonded to each other in such a manner that two major axes of the plurality of primary particles 1 are not parallel to each other, while shapes of the primary particles 1 are maintained. Although FIG. 2D illustrates a case in which three primary particles 1 are bonded to one another, the exemplary embodiment is not limited thereto and four or more primary particles 1 may be bonded to one another. In addition, positions in which the plurality of primary particles 1 are bonded to one another may be variously disposed.

In the case of the oxynitride-based phosphors having shapes illustrated in FIGS. 2A through 2D, attractive force due to van der Waals force may be reduced as compared to the case of an oxynitride-based phosphor having pillar-shaped particles, such that fluidity may be improved. Phosphor particles having improved fluidity may allow for a reduction in processing time when being introduced to a light emitting device, thereby leading to improvements in processability as well as allowing for uniform dispersion of the phosphor particles.

The oxynitride-based phosphor according to an exemplary embodiment may have an average particle size $D_{50}$ of 5 μm to 30 μm. In addition, a quartile deviation (Q.D.) of the particle size of the oxynitride-based phosphor may be 0.18 to 0.40. The quartile deviation may be calculated, for example, according to the following equation 1, and a decrease in quartile deviation means a reduction in particle size distribution.

$$Q.D.=(D_{75}-D_{25})/(D_{75}+D_{25})$$ [Equation 1]

The oxynitride-based phosphor according to an exemplary embodiment irradiated by excitation source may emit light having a peak wavelength in a range of 525 nm to 550 nm, specifically, green light. The excitation source may have a peak wavelength in a range of 420 nm to 470 nm and may be, specifically, a blue light emitting device.

The oxynitride-based phosphor according to an exemplary embodiment may be represented by a compositional formula of $Si_{6-x}Al_xO_xN_{8-x}:Eu_y$, where x is in a range of $0<x\leq0.3$, specifically, in a range of $0.05\leq x\leq0.28$. In addition, y is in a range of $0.001\leq y\leq0.03$, specifically, in a range of $0.003\leq y\leq0.028$.

Hereinafter, the exemplary embodiment will be described in detail through Example and Comparative Example.

EXAMPLE

After power particles such as 964.4 g of $Si_3N_4$, 33.7 g of AlN, and 1.8 g of $Eu_2O_3$ were mixed to each other and were inserted into a boron nitride (BN) crucible, a first temperature-rising operation was performed at a heating rate of 10° C. per minute under a mixed gas atmosphere of hydrogen and nitrogen for 60 minutes, using gas pressure sintering (GPS), in such a manner that a temperature within a high-temperature and high-pressure furnace reaches 600° C.

Thereafter, a second temperature-rising operation was performed at a heating rate of 20° C. per minute for 15 minutes, a third temperature-rising operation was performed at a heating rate of 12° C. per minute for 50 minutes, and a fourth temperature-rising operation was performed at a heating rate of 1° C. per minute for 610 minutes, so that the temperature within the high-temperature and high-pressure furnace reached 1,500° C. In this case, when the temperature within the high-temperature and high-pressure furnace reached 600° C., nitrogen gas injection was started so that a level of pressure within the high-temperature and high-pressure furnace reached 20 bars.

After the fourth temperature-rising operation, a heating operation was performed for 300 minutes such that the temperature within the high-temperature and high-pressure furnace maintained at 2,110° C. Subsequently, the temperature within the high-temperature and high-pressure furnace was cooled to room temperature to complete a primary sintering operation.

After pulverizing a product of the primary sintering operation, 9.4 g of $Eu_2O_3$ was added thereto and mixed therewith, and the mixture was introduced into the high-temperature and high-pressure furnace.

Thereafter, a first temperature-rising operation was performed at a heating rate of 10° C. per minute for 60 minutes in such a manner that the temperature within the high-temperature and high-pressure furnace reached 600° C., a second temperature-rising operation was performed at a heating rate of 20° C. per minute for 15 minutes, a third temperature-rising operation was performed at a heating rate of 15° C. per minute for 40 minutes, a fourth temperature-rising operation was performed at a heating rate of 7° C. per minute for 58 minutes, and a fifth temperature-rising operation was performed at a heating rate of 1° C. per minute for 30 minutes, so that the temperature within the high-temperature and high-pressure furnace reached 1,905° C. In this case, when the temperature within the high-temperature and high-pressure furnace reached 600° C., nitrogen gas injection was started so that a level of pressure within the high-temperature and high-pressure furnace reached 9 bars.

After the fifth temperature-rising operation, a heating operation was performed for 600 minutes such that the temperature within the high-temperature and high-pressure furnace maintained at 1,935° C. Subsequently, the temperature within the high-temperature and high-pressure furnace was cooled to room temperature to complete a secondary sintering operation.

A product of the secondary sintering operation was introduced into the high-temperature and high-pressure furnace, and a first temperature-rising operation was performed at a heating rate of 10° C. per minute for 20 minutes in such a manner that the temperature within the high-temperature and high-pressure furnace reached 200° C., a second temperature-rising operation was performed at a heating rate of 10° C. per minute for 60 minutes, a third temperature-rising operation was performed at a heating rate of 10° C. per minute for 41 minutes, and a fourth temperature-rising operation was performed at a heating rate of 1° C. per minute for 10 minutes, so that the temperature within the high-temperature and high-pressure furnace reached 1,400° C. In this case, when the temperature within the high-temperature and high-pressure furnace reached 200° C., argon gas injection was started so that a level of pressure within the high-temperature and high-pressure furnace reached 1 bar.

After the fourth temperature-rising operation, a heating operation was performed for 600 minutes such that the temperature within the high-temperature and high-pressure furnace maintained at 1,400° C. Subsequently, the temperature within the high-temperature and high-pressure furnace was cooled to room temperature to complete a tertiary sintering operation.

Comparative Example

With the exception that 11.2 g of $Eu_2O_3$ was input prior to the primary sintering operation and a further amount of $Eu_2O_3$ was not added prior to the secondary sintering operation, a process was performed in the same manner as that of Inventive Example.

Figure 3:
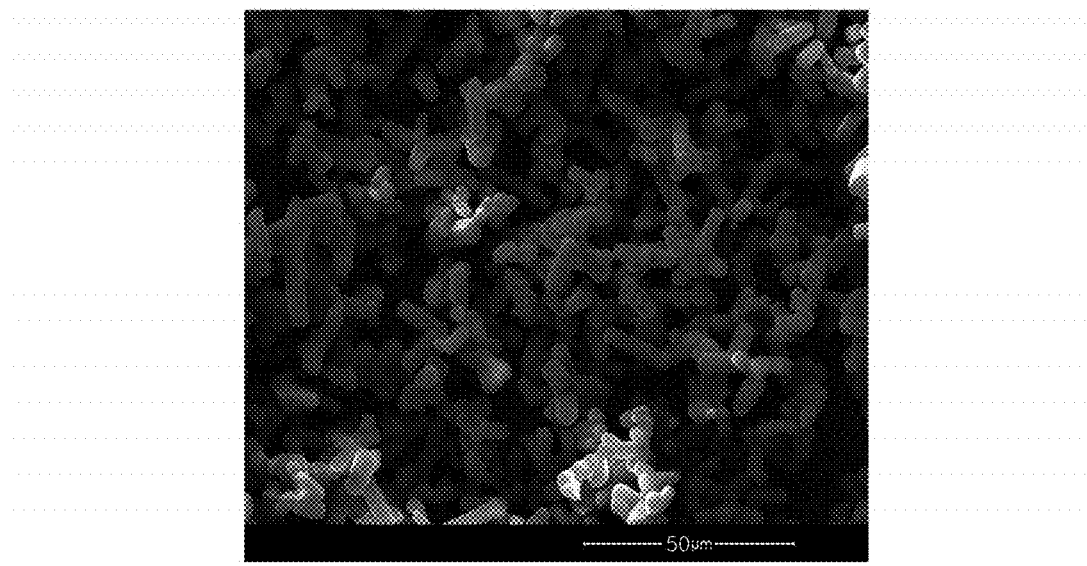
FIG. 3 is an image of the oxynitride-based phosphor according to an exemplary embodiment, obtained using a scanning electron microscope (SEM)

FIG. 3 is an image of the oxynitride-based phosphor according to an exemplary embodiment, obtained using a scanning electron microscope (SEM).

Referring to FIG. 3, in the oxynitride-based phosphor manufactured according to the exemplary embodiment, it can be seen that primary particles having pillar shapes are bonded to each other while maintaining shapes thereof, thereby having a form of a secondary particle.

In order to compare and confirm fluidity of phosphor particles, an angle of repose was measured as follows.

A SUS funnel having an opening of 10 mm was disposed in a position spaced apart from a flat bottom by 50 cm, the oxynitride-based phosphor manufactured according to the exemplary embodiment was input to the funnel, and the phosphor was dropped by gravity. Thereafter, an angle formed by a side surface and a bottom surface of phosphor powder agglomerate collected in a conical shape on the bottom, that is, the angle of repose, was measured.

The measured angle of repose of the oxynitride-based phosphor was 38.7 degrees.

On the other hand, an angle of repose measured according to Comparative Example was 49.8 degrees.

A decrease in the angle of repose refers to improvements in particle fluidity. Thus, it can be seen that fluidity of the oxynitride-based phosphor manufactured according to the exemplary embodiment was increased.

An angle of repose of the oxynitride-based phosphor manufactured according to an exemplary embodiment may be 40 degrees or less. When the angle of repose is 40 degrees or less, fluidity of phosphor particles may be increased, such that processability may be improved in the case of including the phosphor in a light emitting device, and dispersion of the phosphor particles may be increased.

Figure 4A:
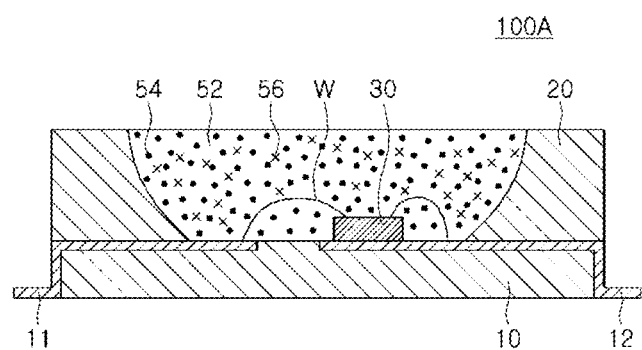
FIGS. 4A and 4B are cross-sectional views illustrating white light emitting devices according to various exemplary embodiments.
Figure 4B:
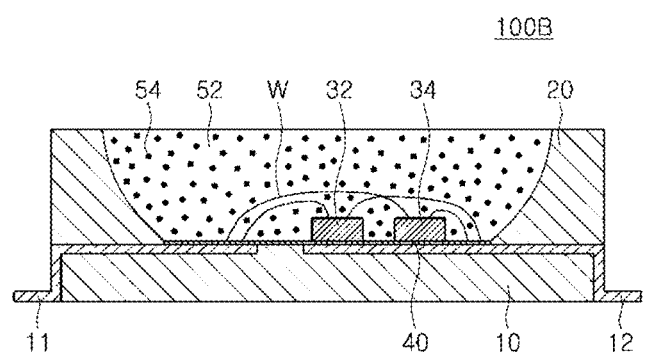

FIGS. 4A and 4B illustrate white light emitting devices employing the oxynitride-based phosphor according to an exemplary embodiment.

A white light emitting device 100A illustrated in FIG. 4A may include a package body 20 having a cavity, a semiconductor light emitting device 30 disposed in the cavity, and a resin packaging part 52 disposed on the semiconductor light emitting device 30 and the cavity. The resin packaging part 52 may be formed of a light-transmissive resin, for example, epoxy, silicone, modified silicone, urethane resin, oxetane resin, acrylics, polycarbonate, or polyimide, and combinations thereof.

In addition, the white light emitting device 100A may include a pair of lead frames 11 and 12 electrically connected to the semiconductor light emitting device 30, and a conductive wire W connecting the semiconductor light emitting device 30 and the lead frames 11 and 12.

The package body 20 may contain an opaque resin or an insulating material having a high degree of reflectance. For example, the package body 20 may be formed of a polymer resin facilitating an injection process or a ceramic material facilitating the emission of heat. The pair of lead frames 11 and 12 may be disposed on the substrate 10 and may be electrically connected to the semiconductor light emitting device 30 so as to apply driving power to the semiconductor light emitting device 30.

In the resin packaging part 52, a red phosphor 54 and a green phosphor 56 may be dispersed. A dominant wavelength of the blue semiconductor light emitting device 30 may be 420 nm to 470 nm. The red phosphor 54 employed in the exemplary embodiment may have a peak wavelength of 600 nm to 650 nm. The green phosphor 56 may have a light emitting wavelength peak of 500 nm to 550 nm, specifically, 525 nm to 550 nm. The blue semiconductor light emitting device 30 may have a full width at half maximum of 10 nm to 50 nm, the red phosphor 54 may have a full width at half maximum of 50 nm to 180 nm, and the green phosphor 56 may have a full width at half maximum of 30 nm to 200 nm.

The green phosphor 56 and other additional phosphors (for example, yellow or yellow-orange phosphors) usable in implementing white light will be described with reference to FIG. 4A and FIG. 4B.

A case in which the white light emitting device 100A illustrated in FIG. 4A uses, as a light source, two types of phosphor excited by blue light, together with the blue semiconductor light emitting device 30, is illustrated; however, a single type of phosphor may be substituted with a semiconductor light emitting device as illustrated in FIG. 4B.

Similarly to the foregoing exemplary embodiment, a white light emitting device 100B illustrated in FIG. 4B may include the package body 20, the lead frames 11 and 12, and the resin packaging part 52. However, unlike the foregoing exemplary embodiment, two semiconductor light emitting devices 32 and 34 may be provided in the cavity.

The first and second semiconductor light emitting devices 32 and 34 may emit light having different wavelengths. For example, the first semiconductor light emitting device 32 may emit blue light and the second semiconductor light emitting device 34 may emit green light. In the exemplary embodiment, the resin packaging part 52 may contain the oxynitride-based phosphor obtained from the exemplary embodiment described above, as a green phosphor.

The semiconductor light emitting devices 30, 32 and 34 illustrated in FIGS. 4A and 4B may be light emitting devices illustrated in FIGS. 6A and 6B through FIG. 8.

Figure 5:
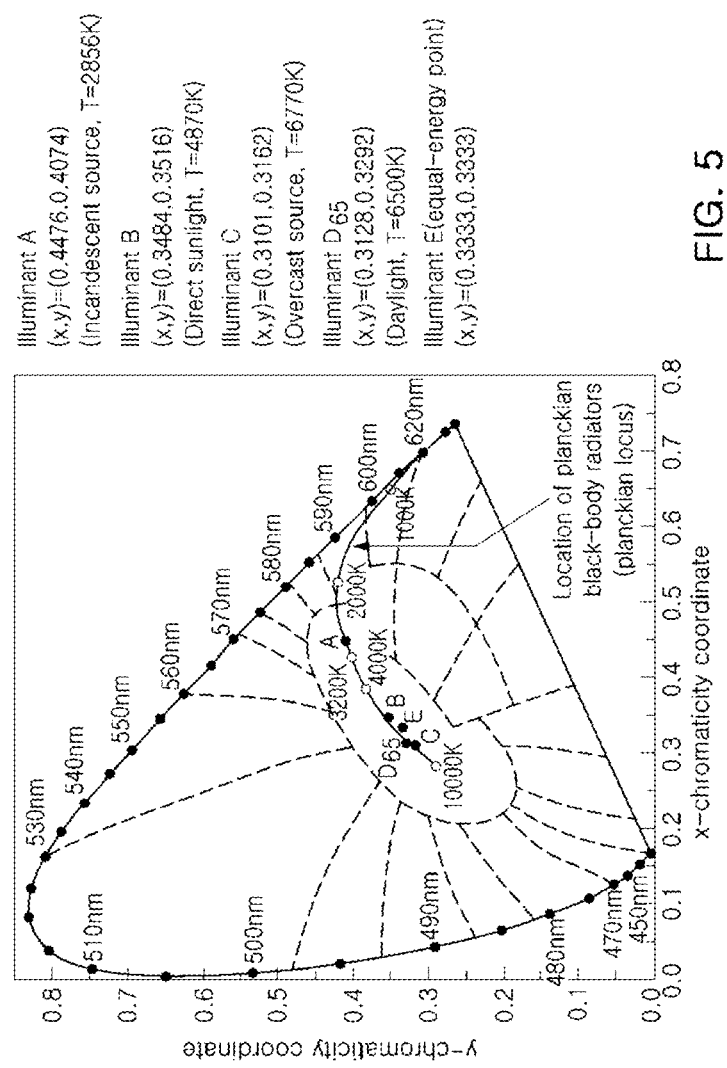
FIG. 5 is the CIE 1931 color space illustrating a wavelength conversion material employable in a white light emitting device according to an exemplary embodiment.

FIG. 5 is the CIE 1931 color space illustrating a wavelength conversion material employable in a white light emitting device according to an exemplary embodiment.

When the semiconductor light emitting devices 30, 32 and 34 (please refer to FIGS. 4A and 4B) emit blue light, light emitting device packages 10, 20 and 30 including at least one of a yellow phosphor, a green phosphor, and a red phosphor may emit while light having various color temperatures by adjusting a mixing ratio of the phosphors. For example, a color temperature and a color rendering index (CRI) of white light may be controlled by further combining a green phosphor and/or a red phosphor with a yellow phosphor.

Referring to the CIE 1931 color space illustrated in FIG. 5, white light formed by combining yellow, green, red phosphors with a UV or blue light emitting diode and/or combining green and red LEDs may have two or more peak wavelengths, and coordinates (x, y) thereof in the CIE 1931 color space illustrated in FIG. 5 may be positioned on a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 color space may be positioned in a region surrounded by the line segment and blackbody radiation spectrum. A color temperature of white light may range from 2,000K to 20,000K.

In the white light emitting devices according to the foregoing exemplary embodiments, the oxynitride-based phosphor according to an exemplary embodiment may be used as a green phosphor and further, the following phosphors may be used.

Red Phosphors: a nitride-based phosphor represented by $M1AlSiN_x:Re (1 \leq x \leq 5)$, a sulfide-based phosphor represented by M1D:Re, and a silicate-based phosphor represented by $(Sr,L)_2SiO_{4-x}N_y:Eu$ ($0<x<4$, $y=2x/3$), where M1 is at least one element selected from a group consisting of Ba, Sr, Ca and Mg, D is at least one element selected from a group consisting of S, Se and Te, L is at least one element selected from a group consisting of Ba, Sr, Ca, Mg, Li, Na, K, Rb and Cs, and Re is at least one element selected from a group consisting of Y, La, Ce, Nd, Pm, Sm, Gd, Tb, Dy, Ho, Er, Tm, Yb, Lu, F, Cl, Br and I.

Yellow Phosphors: a silicate-based phosphor, a garnet-based phosphor such as YAG and TAG, and a nitride-based phosphor ($La_3Si_6N_{11}:Ce$)

Yellow-Orange Phosphors: α-SiAlON:Re phosphors

The phosphor composition may basically accord with stoichiometry and respective elements may be substituted with other elements within respective groups in a periodic table of the elements. For example, Sr may be substituted with Ba, Ca, Mg or the like within the alkaline earth group (II) and Y may be substituted with lanthanum (La) based elements such as Tb, Lu, Sc, Gd or the like. In addition, Eu or the like, an activator, may be substituted with Ce, Tb, Pr, Er, Yb or the like according to a desired energy level. The activator may be used alone or a sub-activator or the like may be added thereto in order to allow for modification of properties.

Further, as a material for substituting for the phosphor, a material such as a quantum dot (QD) or the like may be used, and the QD or the phosphor may be used alone or a combination of the phosphor and the QD may be used. The quantum dot (QD) may be configured to have a core (3~10 nm) formed of CdSe, InP, or the like, a shell (0.5~2 nm) formed of ZnS, ZnSe or the like, and a ligand structure stabilizing the core and the shell, and may implement various colors depending on a size thereof.

The following Table 1 shows types of phosphors in a white light emitting device package using a UV light emitting device (200~440 nm) or a blue light emitting device (440~480 nm) according to application fields.

TABLE 1

| USAGE | Phosphor |
|---|---|
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$), K$_2$TiF$_6$:$Mn^{4+}$, NaYF$_4$:$Mn^{4+}$, NaGdF$_4$:$Mn^{4+}$ Ca2SiO4:$Eu^{2+}$, Ca$_{1.2}$Eu$_{0.8}$SiO$_4$ |
| Lighting Devices | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$), K$_2$TiF$_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |
| Side View (Mobile Devices, Laptop PC) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$), K$_2$TiF$_6$:$Mn^{4+}$, NaYF$_4$:$Mn^{4+}$, |
| Electronic Devices (Headlamps, etc.) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, $0 < y \leq 4$), K$_2$TiF$_6$:$Mn^{4+}$, NaYF$_4$:$Mn^{4+}$, NaGdF$_4$:$Mn^{4+}$, Ca$_2$SiO$_4$:$Eu^{2+}$, Ca$_{1.2}$Eu$_{0.8}$SiO$_4$ |

As needed, a white light emitting device (or package) may implement a color temperature suitable for the surrounding atmosphere by selectively mixing violet, blue, green, red, orange and the like. For example, a white light emitting device having a color temperature of 4,000K, a white light emitting device having a color temperature of 3,000K, and a red light emitting device having a color temperature of 3,000K may be disposed within a single module and may be independently driven to thereby control outputs therefrom, such that a white light emitting module in which a color temperature thereof may be adjusted within a range of 2,000K to 4,000K and a color rendering index Ra thereof is 85 to 99 may be manufactured.

According to another example, a white light emitting device having a color temperature of 5,000K and a white light emitting device having a color temperature of 2,700K may be disposed within a single module and may be independently driven to thereby control outputs therefrom, such that a color temperature may be adjusted within a range of 2,700K to 5,000K. In addition, a white light emitting module in which a color rendering index Ra thereof is 85 to 99 may be manufactured.

The number of light emitting devices may be varied depending on a basic, predetermined value of a color temperature. In the case that the basic, predetermined value of the color temperature is in the vicinity of 4,000K, the number of light emitting devices corresponding to the color temperature of 4,000K may be greater than that of light emitting devices having a color temperature of 3,000K or that of red light emitting devices.

Figure 14:
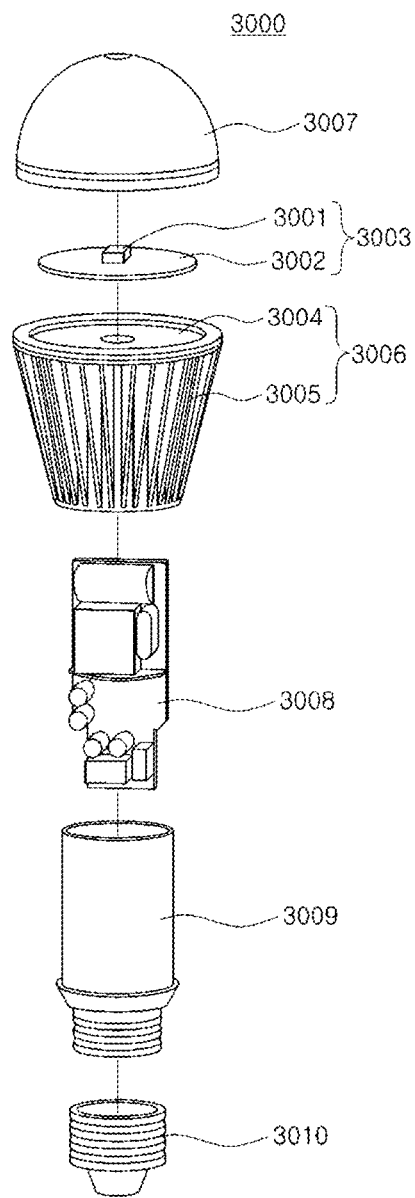
FIG. 14 is an exploded perspective view illustrating a bulb type lighting device according to an exemplary embodiment.

In this manner, a module in which a color rendering index and a color temperature thereof is adjustable may be advantageously used in a lighting device illustrated in FIG. 14, and a semiconductor light emitting device (or module) employing the oxynitride-based phosphor manufactured according to the foregoing exemplary embodiment may be advantageously applied to various application products.

Figure 6A:
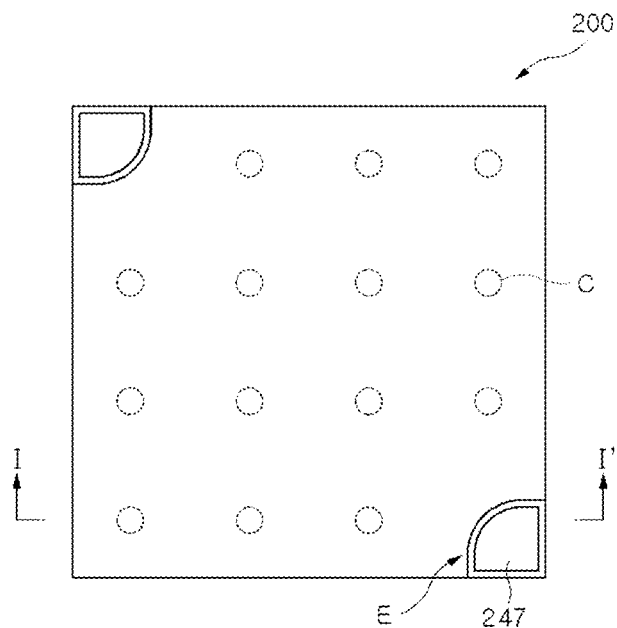
FIGS. 6A and 6B are a plan view and a side cross-sectional view illustrating an example of a semiconductor light emitting device employable in the white light emitting device according to an exemplary embodiment.
Figure 6B:
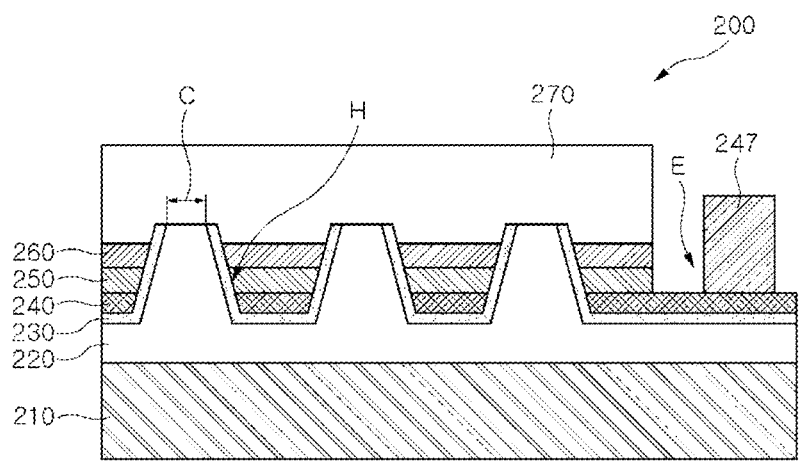

In the white light emitting device according to an exemplary embodiment, various forms of a semiconductor light emitting device may be employed. FIGS. 6A and 6B are a plan view and a side cross-sectional view illustrating an example of a light emitting device employable in an exemplary embodiment. FIG. 6B is a cross-sectional view, taken along line I-I' of FIG. 6A.

First, referring to FIGS. 6A and 6B, a semiconductor light emitting device 200 according to the exemplary embodiment may include a conductive substrate 210, a first electrode 220, an insulating layer 230, a second electrode 240, a second conductivity-type semiconductor layer 250, an active layer 260, and a first conductivity-type semiconductor layer 270, and the respective layers may be sequentially stacked on one another. The first and second conductivity-type semiconductor layers 270 and 250 may be a p-type nitride semiconductor layer and an n-type nitride semiconductor layer, respectively.

The conductive substrate 210 may be a metal substrate or a semiconductor substrate having electrical conductivity. For example, the conductive substrate 210 may be a metal substrate containing one of Au, Ni, Cu and W or a semiconductor substrate containing one of Si, Ge, and GaAs.

The first electrode 220 may be disposed on the conductive substrate 210. A contact hole H may penetrate through the second electrode 240, the second conductivity-type semiconductor layer 250, and the active layer 260 and may be extended to a predetermined region of the first conductivity-type semiconductor layer 270. A portion of the first electrode 220 may be connected to the first conductivity-type semiconductor layer 270 through the contact hole H, whereby the conductive substrate 210 and the first conductivity-type semiconductor layer 270 may be electrically connected to each other.

The second electrode 240 may be disposed to be connected to the second conductivity-type semiconductor layer 250. The second electrode 240 may be electrically insulated from the first electrode 220 by the insulting layer 230. As illustrated in FIG. 6B, the insulating layer 230 may also be formed on an inner side surface of the contact hole H, as well as between the first electrode 220 and the second electrode 240. By doing so, the second electrode 240, the second conductivity-type semiconductor layer 250, and the active layer 260 exposed to an inner side wall of the contact hole H may be insulated from the second electrode 240. A contact region C of the first conductivity-type semiconductor layer 270 may be exposed by the contact hole H, and a portion of the second electrode 240 may be formed to contact the contact region C through the contact hole H.

As illustrated in FIG. 6B, the second electrode 240 may provide an electrode forming region E extended and exposed outwardly of such a semiconductor laminate. The electrode forming region E may include an electrode pad portion 247 for connecting external power to the second electrode 240. Although the exemplary embodiment illustrates a case in which the electrode forming region E is singularly provided, a plurality of electrode forming regions E may be provided as needed. As illustrated in FIG. 6A, the electrode forming region E may be formed at an edge of the semiconductor light emitting device 200 in order to significantly increase a light emitting area. The second electrode 240 may be formed of a material having a high degree of reflectance while forming ohmic contact with the second conductivity-type semiconductor layer 250. The second electrode 240 may be formed of a reflective electrode material exemplified as above.

Figure 7:
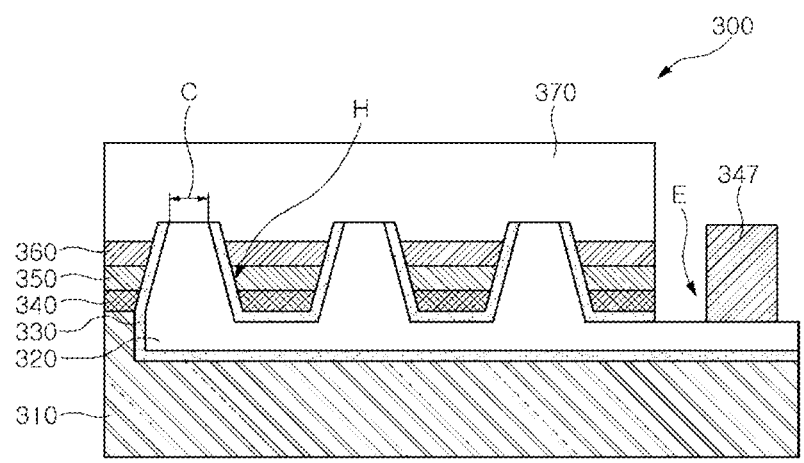
FIG. 7 is a side cross-sectional view illustrating another example of a semiconductor light emitting device employable in the white light emitting device according to an exemplary embodiment.

Unlike semiconductor light emitting device 200 illustrated in FIG. 6B, in the case of a semiconductor light emitting device 300 illustrated in FIG. 7, a first electrode 320 connected to a first conductivity-type semiconductor layer 370 may be outwardly exposed.

Similarly to the foregoing exemplary embodiment, the semiconductor light emitting device 300 illustrated in FIG. 7 may include a conductive substrate 310, and a semiconductor laminate disposed on the conductive substrate 310 and including a second conductivity-type semiconductor layer 350, an active layer 360, and the first conductivity-type semiconductor layer 370. A second electrode 340 may be disposed between the second conductivity-type semiconductor layer 350 and the conductive substrate 310. A contact hole H may be formed in the semiconductor laminate to expose a contact region C of the first conductivity-type semiconductor layer 370, and the contact region C may be connected to a portion of the first electrode 320. The first electrode 320 may be electrically isolated from the active layer 360, the second conductivity-type semiconductor layer 350, the second electrode 340, and the conductive substrate 310. An insulating layer 330 may be provided between the first electrode 320 and one or more from among the substrate 310, the second conductivity-type semiconductor layer 350, the active layer 360, and second electrode 340. Unlike the foregoing exemplary embodiment, the first electrode 320 may provide an electrode forming region E extended and exposed outwardly of the semiconductor laminate. An electrode pad portion 347 may be formed on the electrode forming region E. In addition, the second electrode 340 may be directly connected to the conductive substrate 310, such that the conductive substrate 310 may be provided as an electrode connected to the second conductivity-type semiconductor layer 350.

Figure 8:
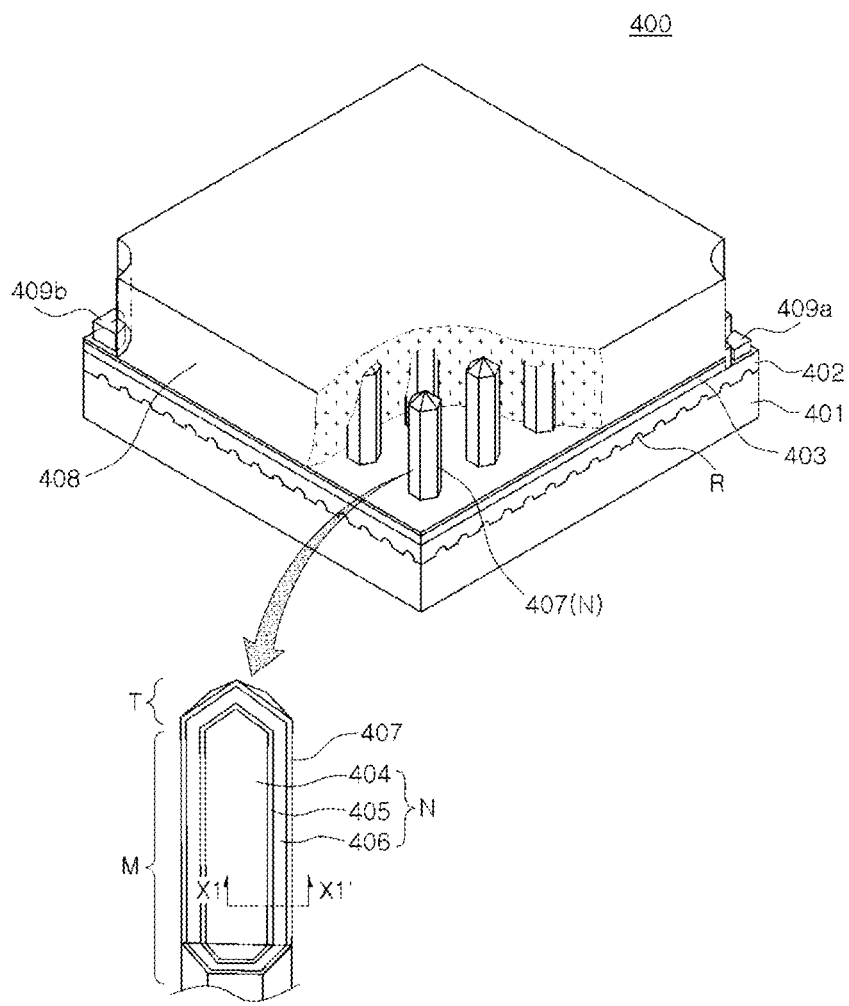
FIG. 8 is a perspective view illustrating another example of a semiconductor light emitting device employable in the white light emitting device according to an exemplary embodiment.

FIG. 8 is a schematic perspective view illustrating a nanostructure semiconductor light emitting device employable in the light emitting device according to an exemplary embodiment.

Referring to FIG. 8, a nanostructure semiconductor light emitting device 400 may include a base layer 402 formed of a first conductivity-type semiconductor material and a plurality of light emitting nanostructures (N) disposed on the base layer 402.

The nanostructure semiconductor light emitting device 400 may include a substrate 401 having an upper surface on which the base layer 402 is disposed. An unevenness structure R may be formed on the upper surface of the substrate 401. The unevenness structure R may improve light extraction efficiency and may enhance quality of a grown single-crystal. The substrate 401 may be an insulating substrate, a conductive substrate or a semiconductor substrate. For example, the substrate 401 may be sapphire, SiC, Si, $MgAl_2O_4$, MgO, $LiAlO_2$, $LiGaO_2$, or GaN. The nanostructure semiconductor light emitting device 400 may also include electrode pad portions 409a and 409b for connecting external power to the nanostructure semiconductor light emitting device 400.

The base layer 402 may contain a first conductivity-type nitride semiconductor layer and may provide a growth surface for growth of the light emitting nanostructures N. The base layer 402 may be a nitride semiconductor satisfying $In_xAl_yGa_{1-x-y}N$ ($0 \leq x < 1$, $0 \leq y < 1$, $0 \leq x+y < 1$) and may be doped with an n-type impurity such as Si. For example, the base layer 402 may be n-type GaN.

An insulating layer 403 having openings for growth of the light emitting nanostructures N (in particular, nanocores 404) may be formed on the base layer 402. The nanocores 404 may be formed on regions of the base layer 402 exposed by the openings. The insulating layer 403 may be used as a mask for growth of the nanocores 404. For example, the insulating layer 403 may be formed of an insulating material such as $SiO_2$ or $SiN_x$.

Each of the light emitting nanostructures N may include a main portion M having a hexagonal prismatic structure and an upper end portion T positioned on the main portion M. Side surfaces of the main portion M of the light emitting nanostructure N may have the same crystal faces, and the upper end portion T of the light emitting nanostructure N may have crystal faces different from those of the side surfaces thereof. The upper end portion T of the light emitting nanostructure N may have a hexagonal pyramid shape. The division of such a structure may be actually determined by the nanocore 404, and the nanocore 404 may be understood as being divided into a main portion M and an upper end portion T.

Each of the light emitting nanostructures N may have the nanocore 404 formed of a first conductivity-type nitride semiconductor, an active layer 405 and a second conductivity-type nitride semiconductor layer 406 sequentially disposed on a surface of the nanocore 404. The contact electrode layer 407 is electrically connected to the second conductivity-type semiconductor layer 404. The contact electrode layer 407 may cover upper surfaces and lateral surfaces of the light emitting nanostructures N and may be connected between adjacent light emitting nanostructures N. The contact electrode layer 407 may be formed of, for example, indium tin oxide (ITO), aluminum zinc oxide (AZO), indium zinc oxide (IZO), zinc oxide (ZnO), GZO (ZnO:Ga), indium oxide ($In_2O_3$), tin oxide ($SnO_2$), cadmium oxide (CdO), cadmium tin oxide ($CdSnO_4$), or gallium oxide ($Ga_2O_3$). The filler layer 408 may fill spaces between adjacent light emitting nanostructures N and may be disposed to cover the light emitting nanostructures N and the contact electrode layer 407. The filler layer 408 may be formed of a light-transmissive insulating material and include, for example, silicon dioxide ($SiO_2$), silicon nitride ($SiN_x$), aluminum oxide ($Al_2O_3$), hafnium oxide (HfO), titanium oxide ($TiO_2$), or zirconium oxide (ZrO).

Figure 9:
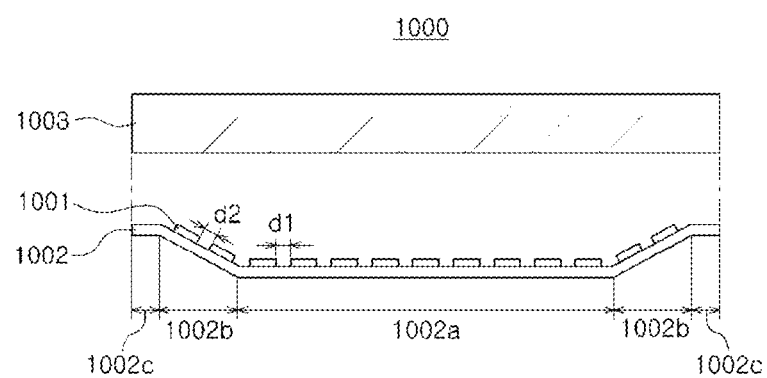
FIGS. 9 and 10 are cross-sectional views illustrating backlight units according to various exemplary embodiments.
Figure 10:
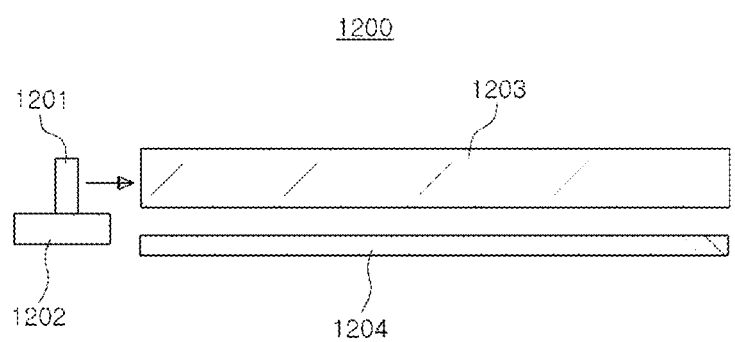

FIGS. 9 and 10 illustrate examples of a backlight unit in which the semiconductor light emitting device according to an exemplary embodiment is employed.

Referring to FIG. 9, a backlight unit 1000 may include light sources 1001 mounted on a circuit board 1002 and at least one optical sheet 1003 disposed thereabove.

Each of the light sources 1001 may be a white light emitting device containing the oxynitride-based phosphor manufactured according to an exemplary embodiment. The circuit board 1002 employed in the exemplary embodiment may have a first planar portion 1002a corresponding to a main region, an inclined portion 1002b disposed in a circumferential portion of the first planar portion 1002a and having at least partially bent portion, and a second planar portion 1002c disposed at an edge of the circuit board 1002, positioned outwardly of the inclined portion 1002b. The light sources may be arranged on the first planar portion 1002a at a first interval d1, and one or more light sources 1001 may be arranged on the inclined portion 1002b at a second interval d2. The first interval d1 may be identical to the second interval d2. A width of the inclined portion 1002b (or a length in a cross-section) may be narrower than a width of the first planar portion 1002a and may be larger than a width of the second planar portion 1002c. As needed, at least one light source may also be arranged on the second planar portion 1002c.

An inclination of the inclined portion 1002b with respect to the first planar portion 1002a may be appropriately adjusted within a range of greater than 0 degrees and lower than 90 degrees. The circuit board 1002 has such a structure, whereby uniform luminance may be maintained even in the vicinity of an edge of the optical sheet 1003.

The light source 1001 in the backlight unit 1000 of FIG. 9 emits light toward a liquid crystal display (LCD) device disposed thereabove. On the other hand, a light source 1201 mounted on a substrate 1202 in a backlight unit 1200 according to another embodiment illustrated in FIG. 10 emits light laterally and the emitted light is incident to a light guide plate 1203 and may be converted into the form of a surface light source. The light having passed through the light guide plate 1203 may be emitted upwardly and a reflective layer 1204 may be formed under a bottom surface of the light guide plate 1203 in order to improve light extraction efficiency.

Unlike the foregoing exemplary embodiment, a phosphor may not be directly disposed in a semiconductor light emitting device or package and may also be disposed in other components of the backlight unit. These exemplary embodiments are illustrated in FIG. 11 and FIGS. 12A and 12B.

Figure 11:
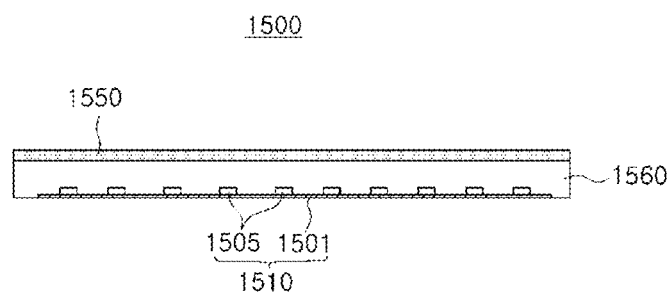
FIG. 11 is a cross-sectional view illustrating a direct type backlight unit according to an exemplary embodiment.

As illustrated in FIG. 11, a drop type backlight unit 1500 according to the exemplary embodiment may include a phosphor film 1550 and a light source module 1510 disposed on a lower surface of the phosphor film 1550. The phosphor film 1550 may contain at least the oxynitride-based phosphor manufactured according to an exemplary.

The backlight unit 1500 of FIG. 11 may include a bottom case 1560 capable of accommodating the light source module 1510 therein. In the exemplary embodiment, the phosphor film 1550 may be disposed on the bottom case 1560. At least a portion of light emitted by the light source module 1510 may be wavelength-converted by the phosphor film 1550. The phosphor film 1550 may be manufactured and used as a separate film, but may be integrally combined with a light diffusing plate. The LED light source module 1510 may include a circuit board 1501 and a plurality of semiconductor light emitting devices 1505 mounted on an upper surface of the circuit board 1501. The semiconductor light emitting device employed in the exemplary embodiment may be a semiconductor light emitting device to which a phosphor is not applied.

Figure 12A:
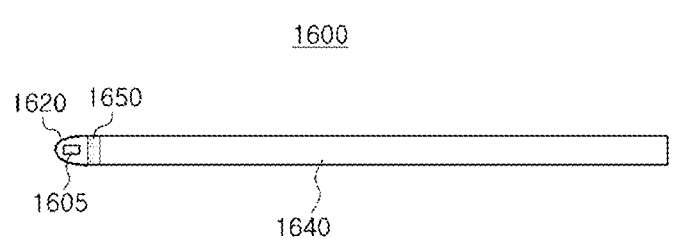
FIGS. 12A and 12B are cross-sectional views each illustrating an edge type backlight unit according to an exemplary embodiment.
Figure 12B:
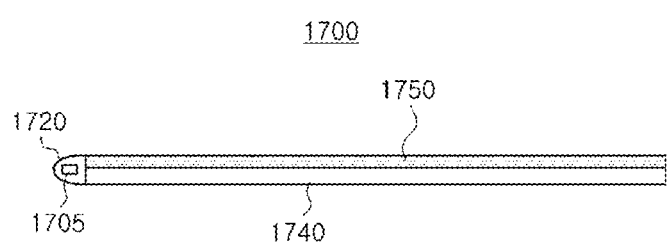

FIGS. 12A and 12B illustrate edge type backlight units according to other exemplary embodiments.

An edge type backlight unit 1600 illustrated in FIG. 12A may include a light guiding plate 1640 and a semiconductor light emitting device 1605 provided at one end surface of the light guiding plate 1640. Light emitted by the semiconductor light emitting device 1605 may be guided to the interior of the light guiding plate 1640 by a reflective structure 1620. In the exemplary embodiment, a phosphor film 1650 may contain the oxynitride-based phosphor manufactured according to an exemplary embodiment and may be positioned between the end surface of the light guiding plate 1640 and the semiconductor light emitting device 1605.

An edge type backlight unit 1700 illustrated in FIG. 12B may include a light guiding plate 1740, and a semiconductor light emitting device 1705 and a reflective structure 1720 provided at one end surface of the light guiding plate 1740. A phosphor film 1750 employed in the exemplary embodiment may contain the oxynitride-based phosphor manufactured according to an exemplary embodiment, and is illustrated as being applied to a light emitting surface of the light guiding plate 1740.

In this manner, the oxynitride-based phosphor manufactured according to an exemplary embodiment may not be directly disposed in a semiconductor light emitting device and may also be disposed in other components of the backlight unit.

Figure 13:
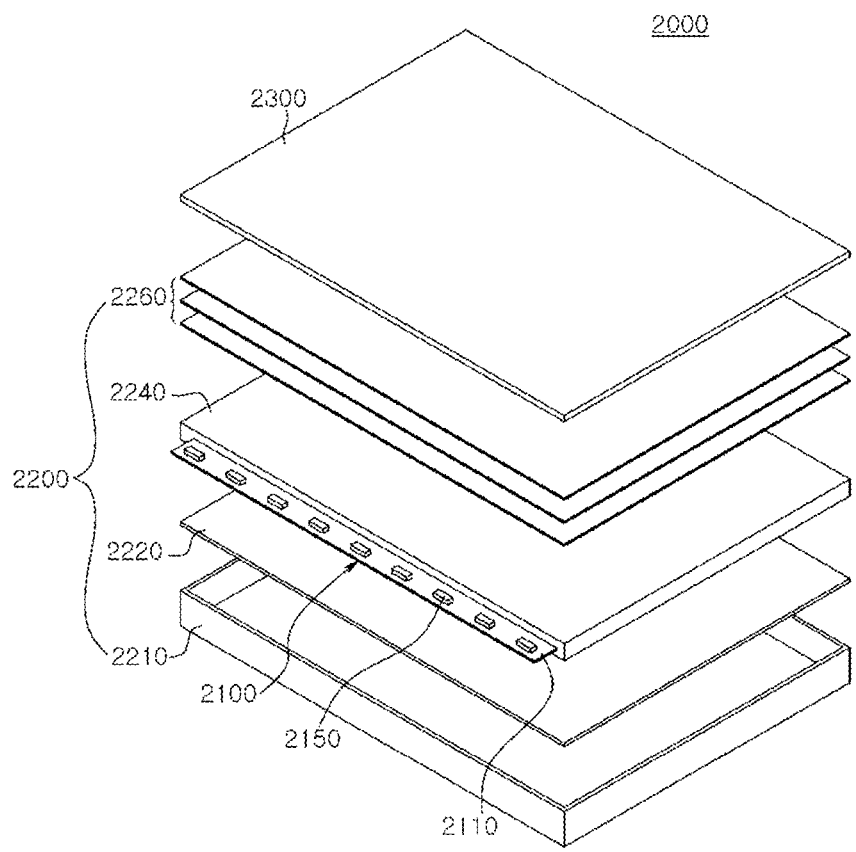
FIG. 13 is an exploded perspective view illustrating a display device according to an exemplary embodiment.

FIG. 13 is an exploded perspective view illustrating a display device according to an exemplary embodiment.

A display device 2000 illustrated in FIG. 13 may include a backlight unit 2200 and an image display panel 2300 such as a liquid crystal panel. The backlight unit 2200 may include a light guiding plate 2240 and an LED light source module 2100 provided on at least one side surface of the light guiding plate 2240.

In the exemplary embodiment, the backlight unit 2200 may further include a bottom case 2210 and a reflective plate 2220 disposed below the light guiding plate 2240, as illustrated in the exemplary embodiment.

In accordance with demands for various optical properties, various types of optical sheets 2260 such as diffusion sheets, prism sheets, and protective sheets may be provided between the light guiding plate 2240 and the image display panel 2300.

The LED light source module 2100 may include a circuit board 2110 provided at least one side surface of the light guiding plate 2240 and a plurality of semiconductor light emitting devices 2150 mounted on the circuit board 2110 and allowing light to be incident onto the light guiding plate 2240. The plurality of semiconductor light emitting devices 2150 may be a package containing the oxynitride-based phosphor manufactured according to an exemplary embodiment. The plurality of semiconductor light emitting devices 2150 employed in the exemplary embodiment may be a side-view type light emitting device package in which a mounting surface thereof is a side surface adjacent to a light emitting surface thereof.

FIG. 14 is an exploded perspective view illustrating an example of a lighting device in which the semiconductor light emitting device according to an exemplary embodiment is employed.

A lighting device 3000 illustrated in FIG. 14 is exemplified as a bulb-type lamp, and may include a light emitting module 3003, a driving unit 3008, and an external connector unit 3010. In addition, exterior structures such as an external housing 3006, an internal housing 3009, a cover unit 3007 and the like may be additionally included.

The light emitting module 3003 may include an LED light source 3001 provided as the semiconductor light emitting device described above, and a circuit board 3002 on which the light source 3001 is mounted. For example, first and second electrodes of the semiconductor light emitting device may be electrically connected to electrode patterns of the circuit board 3002. The embodiment illustrates a case in which a single light source 3001 is mounted on the circuit board 3002; however, if necessary, a plurality of light sources may be mounted thereon. In addition, the LED light source 3001 may contain the oxynitride-based phosphor manufactured according to an exemplary embodiment.

The external housing 3006 may serve as a heat radiating part, and include a heat sink plate 3004 in direct contact with the light emitting module 3003 to improve the dissipation of heat and heat radiating fins 3005 covering a lateral surface of the lighting device 3000. The cover unit 3007 may be mounted above the light emitting module 3003 and may have a convex lens shape. The driving unit 3008 may be disposed inside the internal housing 3009 and may be connected to the external connector unit 3010, such as a socket structure, to receive power from an external power source.

In addition, the driving unit 3008 may convert the received power into a current source appropriate for driving the semiconductor light emitting device 3001 of the light emitting module 3003 and supply the converted current source thereto. For example, the driving unit 3008 may be configured of an AC-DC converter, a rectifying circuit part, or the like.

As set forth above, according to exemplary embodiments, an oxynitride-based phosphor having a form allowing for improvements in process properties in a process including the oxynitride-based phosphor in a light emitting device, may be provided.

While exemplary embodiments have been shown and described above, it will be apparent to those skilled in the art that modifications and variations could be made without departing from the scope of the inventive concept as defined by the appended claims.

What is claimed is:

1. An oxynitride-based phosphor comprising:
a β-type $Si_3N_4$ crystal structure and represented by a compositional formula of $Si_{6-x}Al_xO_xN_{8-x}$: $Eu_y$ ($0 < x \leq 0.3$, $0.001 \leq y \leq 0.03$),
wherein the oxynitride-based phosphor comprises a form of a secondary particle comprising a plurality of primary particles bonded to each other while maintaining shapes of the primary particles, the plurality of primary particles having pillar shapes.

2. The oxynitride-based phosphor of claim 1, wherein an angle of repose of the oxynitride-based phosphor is 40 degrees or less.

3. The oxynitride-based phosphor of claim 1, wherein the plurality of primary particles are bonded to each other in a radial manner.

4. The oxynitride-based phosphor of claim 1, wherein the secondary particle has a form in which the plurality of primary particles are bonded to each other in such a manner that at least two major axial directions of the plurality of primary particles are identical to each other.

5. The oxynitride-based phosphor of claim 1, wherein the plurality of primary particles respectively have an aspect ratio of 1 to 100.

6. The oxynitride-based phosphor of claim 1, wherein the oxynitride-based phosphor has an average particle size $D_{50}$ of 5 μm to 30 μm.

7. The oxynitride-based phosphor of claim 1, wherein a quartile deviation (Q.D.) of a particle size of the oxynitride-based phosphor is 0.18 to 0.40.

8. The oxynitride-based phosphor of claim 1, wherein the oxynitride-based phosphor irradiated by an excitation source emits light having a peak wavelength in a range of 525 nm to 550 nm.

9. The oxynitride-based phosphor of claim 8, wherein the excitation source has a peak wavelength in a range of 420 nm to 470 nm.

10. The oxynitride-based phosphor of claim 1, wherein in the compositional formula, x is in a range of $0.05 \leq x \leq 0.28$.

11. The oxynitride-based phosphor of claim 1, wherein in the compositional formula, y is in a range of $0.003 \leq y \leq 0.028$.

12. A white light emitting device comprising:
a semiconductor light emitting device emitting excitation light;
the oxynitride-based phosphor of claim 1, disposed in a circumferential portion of the semiconductor light emitting device and converting a wavelength of at least a portion of the excitation light into a wavelength of green light; and
at least one light emitting element providing light having a wavelength different from the wavelength of light emitted by the semiconductor light emitting device and the converted wavelength of green light,
wherein the at least one light emitting element is at least one from among another semiconductor light emitting device and another phosphor.

13. The white light emitting device of claim 12, wherein the semiconductor light emitting device comprises a blue semiconductor light emitting device having a dominant wavelength of 420 nm to 470 nm.

14. The white light emitting device of claim 12, wherein the at least one light emitting element comprises a red phosphor.

15. The white light emitting device of claim 12, wherein the at least one light emitting element comprises a yellow phosphor or a yellow-orange phosphor.

16. A white light emitting device comprising:
a semiconductor light emitting device emitting excitation light, the semiconductor light emitting device comprising an oxynitride-based phosphor having a β-type Si3N4 crystal structure and represented by a compositional formula of $Si_{6-x}Al_xO_xN_{8-x}$: $Eu_y$ ($0<x\leq0.3$, $0.001\leq y\leq0.03$), the oxynitride-based phosphor comprising a form of a secondary particle comprising a plurality of primary particles bonded to each other while maintaining pillar shapes of the primary particles; and
at least one light emitting element providing light having a wavelength different from a wavelength of light emitted by the semiconductor light emitting device,
wherein the at least one light emitting element is at least one from among another semiconductor light emitting device and another phosphor.

17. The white light emitting device of claim 16, wherein the oxynitride-based phosphor is disposed in a circumferential portion of the semiconductor light emitting device.

18. The white light emitting device of claim 16, wherein the oxynitride-based phosphor is configured to convert a wavelength of at least a portion of the excitation light into a wavelength of green light.

19. The white light emitting device of claim 16, wherein the oxynitride-based phosphor comprises a form of a secondary particle comprising a plurality of primary particles bonded to each other, the plurality of primary particles having pillar shapes.

20. The white light emitting device of claim 16, wherein the at least one light emitting element comprises a red phosphor, a yellow phosphor or a yellow-orange phosphor.

* * * * *